(12) United States Patent
Weber

(10) Patent No.: US 8,779,536 B2
(45) Date of Patent: Jul. 15, 2014

(54) HYBRID INTEGRATED PRESSURE SENSOR COMPONENT

(71) Applicant: Heribert Weber, Nuertingen (DE)

(72) Inventor: Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/044,223

(22) Filed: Oct. 2, 2013

(65) Prior Publication Data

US 2014/0091405 A1  Apr. 3, 2014

(30) Foreign Application Priority Data

Oct. 2, 2012 (DE) .......................... 10 2012 217 979

(51) Int. Cl.
*B81B 3/00* (2006.01)

(52) U.S. Cl.
CPC .................................. *B81B 3/0021* (2013.01)
USPC ............ 257/416; 257/621; 257/417; 257/415

(58) Field of Classification Search
USPC .................................. 257/416, 621, 417, 415
See application file for complete search history.

(56) References Cited

U.S. PATENT DOCUMENTS

| 2007/0181962 A1* | 8/2007 | Partridge et al. ............. 257/414 |
| 2011/0049652 A1 | 3/2011 | Wu et al. |

* cited by examiner

*Primary Examiner* — Marc Armand
(74) *Attorney, Agent, or Firm* — Kenyon & Kenyon LLP

(57) ABSTRACT

A pressure sensor component includes a MEMS component having at least one pattern element that is able to be deflected perpendicular to the component plane, which is equipped with at least one electrode of a measuring capacitor device, and an ASIC component having integrated circuit elements and at least one back end stack, at least one counter-electrode of the measuring capacitor device being developed in a metallization plane of the back end stack. The MEMS component is mounted on the back end pile of the ASIC component. The MEMS component includes at least one pressure-sensitive diaphragm pattern and is mounted on the ASIC component in such a way that the pressure-sensitive diaphragm pattern spans a cavity between the MEMS component and the back end stack of the ASIC component.

11 Claims, 8 Drawing Sheets

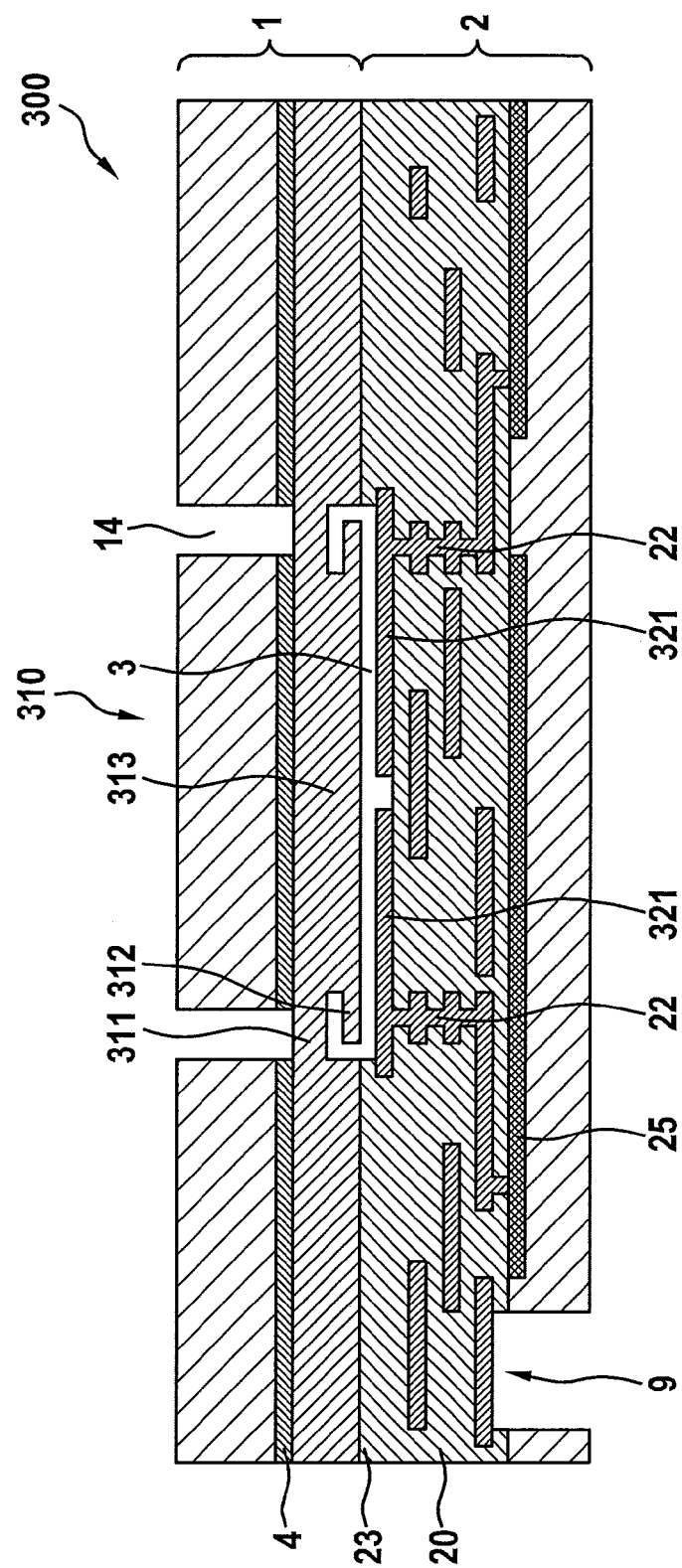

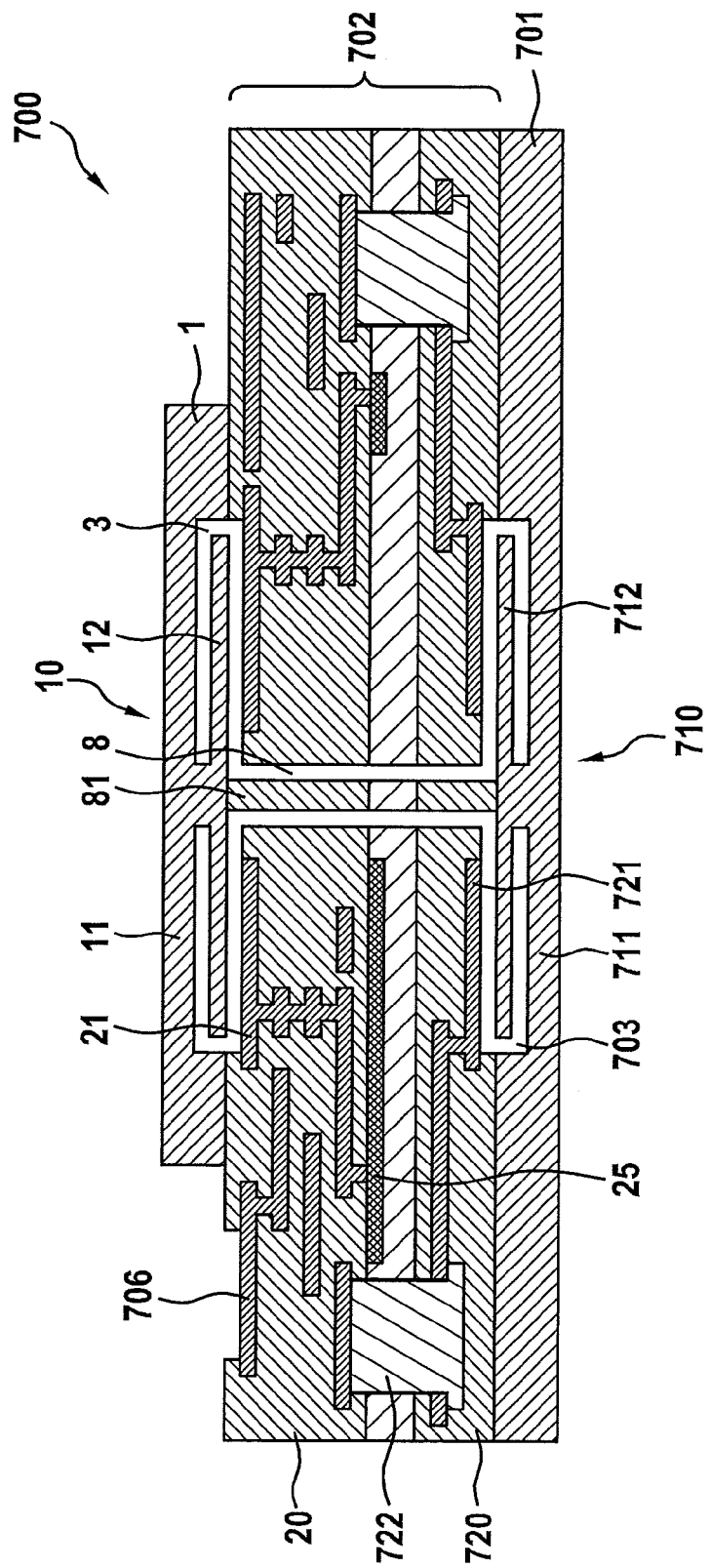

HYBRID INTEGRATED PRESSURE SENSOR COMPONENT

FIELD OF THE INVENTION

The present invention relates to a hybrid integrated pressure sensor component, including at least one MEMS (microelectromechanical system) component having at least one pattern feature that is able to be deflected perpendicular to the component plane, which is equipped with at least one electrode of a measuring capacitor device and one ASIC (application-specific integrated circuit) component having integrated circuit elements and at least one back end pile, at least one counter-electrode of the measuring capacitor device being developed in a metallization plane of the back end pile. The MEMS component is mounted on the back end stack of the ASIC component.

BACKGROUND INFORMATION

In United States Published Patent Appln. No. 2011/0049652, a vertically integrated component having an ASIC component and a MEMS component is described which, based on the micromechanical patterning of the MEMS component, is conceived as an inertial sensor or actuator. For, in this case, the micromechanical patterning includes a flexibly suspended seismic mass, which is deflectable perpendicular to the component plane. The MEMS component is mounted on the ASIC component in such a way that the "out-of-plane" motion of the seismic mass is not impeded. The known component is equipped with a capacitor device for measuring signal acquisition and actuation of the actuator pattern. This capacitor system includes a deflectable electrode on the flexibly supported seismic mass and stationary counter-electrodes, which are developed in a patterned metal layer on the surface of the ASIC substrate.

The known component concept makes possible a cost-effective mass production of robust components having a micromechanical function and a signal processing circuit. In this context, not only the individual components ASIC component and MEMS component are produced in the wafer composite. Their assembly to form a component is also implemented on a wafer plane. In addition, the MEMS functions and the ASIC functions are able to be tested on the wafer plane, and even the adjustment of the individual components may be performed even before they are cut apart. In addition, based on the stacked buildup, the known components require a comparatively small assembly area, which also has a favorable effect on production costs of the end products.

Pressure sensors are known from experience that have a pressure-sensitive diaphragm, in which the pressure-conditioned diaphragm deflections are recorded with the aid of a measuring capacitor device. For this, the diaphragm is equipped with at least one electrode, which cooperates with at least one stationary counter-electrode of the measuring capacitor device. In the case of a pressure effect, the diaphragm electrode is deflected together with the diaphragm, which is detected as a change in capacitance of the measuring capacitor device. Since the diaphragm of a pressure sensor is closed, as a rule, that is, it is linked into the sensor construction at the diaphragm circumference, it is not deflected plane-parallel when there is a pressure effect but becomes warped. Based on this diaphragm warping, a linear pressure increase, if at all, only leads in a relatively limited pressure range to a linear capacitance change, so that the measuring signal frequently is linearized subsequently within the scope of measuring signal evaluation. In addition, the magnitude of the capacitive measuring signal, and thus also the sensor sensitivity are a function of the diaphragm size, and with that, of the pressure range for which the sensor is designed.

SUMMARY

Starting from the component concept known from United States Published Patent Appln. No. 2011/0049652, in the present invention measures are provided for implementing a pressure sensor component having a characteristic line behavior that is linear to a great extent and high sensitivity.

For this, the MEMS component of the pressure sensor component according to the present invention, includes a pressure-sensitive diaphragm patterning as a deflectable pattern feature. The MEMS component is mounted on the ASIC component in such a way that the pressure-sensitive diaphragm pattern spans a cavity between the MEMS component and the back end stack of the ASIC component. A characteristic line behavior, that is linear to a great extent, is achieved, according to the present invention, in that the pressure-sensitive diaphragm pattern includes a diaphragm element which closes the cavity on the MEMS side, and at least one electrode carrier, which is situated within the cavity and is mechanically coupled to the diaphragm element in such a way that a pressure-conditioned deformation of the diaphragm element effects a deflection of the electrode carrier essentially perpendicular to the diaphragm plane, but the electrode carrier is not deformed in the process.

According to the present invention, the at least one deflectable electrode of the measuring capacitor device is thus not positioned on the closed diaphragm element, in this case, which becomes warped by the measuring pressure, but on one of its own electrode carriers. When there is a pressure effect, the latter is deflected together with the diaphragm element, namely, essentially perpendicular to the diaphragm plane and with that, also perpendicular to the counter-electrode of the measuring capacitor device. The mechanical connection to the diaphragm element is designed, according to the present invention, in such a way that the electrode carrier is not warped in this context. Thereby the nonlinear influence of warping of the diaphragm element on the capacitive measuring signal is eliminated to a great extent or is at least clearly reduced.

Besides that, it is of particular advantage that the diaphragm element and the electrode carrier of the diaphragm pattern do not have to have the same planar extension. In particular, the electrode on the electrode carrier may also be designed to be bigger than the diaphragm element. Since the measuring signal magnitude, and, with that, also the measuring sensitivity are essentially a function of the electrode areas of the measuring capacitor device, in such a way, at least within certain limits, that the influence on the measuring sensitivity of a pressure sensor component according to the present invention, may be taken, namely independently of the parameters size and thickness of the diaphragm element, which determine the pressure range of the pressure sensor component.

Since the electrodes of the measuring capacitor device, of the pressure sensor component according to the present invention, are situated inside a cavity between a MEMS component and an ASIC component, and the remaining circuit components on the upper side of the ASIC component are also protected from environmental influences by the MEMS component, the pressure sensor component according to the present invention is particularly robust and is also suited for use in an aggressive measuring environment.

There are basically various possibilities for implementing a pressure sensor component according to the present invention, especially as relating to the diaphragm pattern having a diaphragm element and electrode carrier, but also with regard to the use as absolute pressure sensor or differential pressure sensor.

In one preferred specific embodiment variant of the present invention, the electrode carrier is a planar pattern feature which is oriented essentially in parallel to the diaphragm element, and is accordingly deflected together with the diaphragm perpendicular to the counter-electrodes but essentially in a plane-parallel manner. Such an electrode carrier is implemented very simply using standard methods of micromechanics in the layer construction of the MEMS component. In addition, it enables the implementation of large-area capacitor electrodes in the component plane, so that the MEMS component is also able to be produced in the form of a thin chip, that is, having a very small overall height.

As was mentioned above, according to the present invention, the electrode carrier is connected to the diaphragm element of the diaphragm pattern in such a way that, in response to the deflection and becoming warped of the diaphragm element perpendicular to the diaphragm plane, it is deflected, but not warped in the process. This may simply be achieved particularly in the case of a planar electrode carrier by a point by point connection between the diaphragm element and the electrode carrier. The connecting place is advantageously developed in the center section of the diaphragm element. The diaphragm element experiences its greatest deflection in this range when pressure is acting on it. Since the deflection of the connecting place is transmitted directly to the electrode carrier, the largest measuring signal is generated in this way by a given measuring pressure.

In one additional specific embodiment of the present invention, the electrode carrier is connected to the diaphragm element via a plurality of connecting points. In order for the electrode carrier to be deflected as much perpendicular as possible to the diaphragm plane in this case too, the connecting points are situated, in this case, on the same level of the deflected diaphragm element. This specific embodiment stands out by a very stable diaphragm pattern, particularly with regard to transverse accelerations. At this point it should be mentioned that the connection between an electrode carrier and the diaphragm element may also be produced via a planar connecting area, to avoid bending of the diaphragm pattern based on transverse accelerations.

Depending on the measuring pressure range, it may be meaningful to reinforce the center region of the diaphragm element to which the electrode carrier is connected, in order, in this way, to prevent a warping of the central region. In this case, the diaphragm element is implemented in the form of an annular diaphragm, via whose geometric shape the spring constant of the diaphragm element, and thus the deflection of the electrode carrier is able to be influenced.

The embodiment variations according to the present invention named above attempt to reduce the influence of transverse accelerations on the measuring signal by the suitable design of the diaphragm pattern. In one particularly advantageous refinement of the present invention, the capacitor device of the pressure sensor component is conceived in such a way that the influence of transverse accelerations on the measuring signal is able to be detected and consequently also eliminated. For this purpose, two capacitor patterns have to be situated in the region of the cavity, i.e. on the electrode carrier and the ASIC back end stack, in order, in addition to detecting a deflection perpendicular to the diaphragm plane, to detect also a tilting or deformation of the electrode carrier.

The pressure sensor component according to the present invention may be designed as an absolute pressure sensor. In this case, the cavity has to be sealed pressure-tight between the MEMS component and the ASIC component. This may be achieved simply by a suitable mounting technique, such as seal glass bonding, fusion bonding or eutectic bonding.

The pressure sensor component according to the present invention may also be conceived as a relative pressure sensor. In this case, at least one connecting opening to the cavity has to be developed in the component, which is used as the pressure connection. The pressure connection advantageously extends through the ASIC component having the back end stack, since, in that case, in at least one metallization plane of the back end stack, a screen pattern is able to be developed as a filter for the pressure connection. In this way, one is able to prevent at least the penetration of particles from the measuring environment into the cavity, and with that, into the measuring capacitor device.

The component concept according to the present invention further makes possible the implementation of a double pressure sensor component. To do this, an ASIC component is also provided on the back side with a back end stack. On this back side back end stack, a second MEMS component having a pressure-sensitive diaphragm pattern is then mounted, so that the pressure-sensitive diaphragm pattern spans a cavity between the second MEMS component and the back side back end stack. Just as the diaphragm pattern of the first MEMS component, the diaphragm pattern of the second MEMS component is also provided with at least one electrode, which forms a measuring capacitor device with at least one counter-electrode in a metallization plane of the back side back end stack. The ASIC component having the front side and the back side back end stack is thus situated in this case in a sandwich-like manner between two MEMS components. If the front side and the back side cavity have each be closed to be pressure-tight, then, with the aid of such a double pressure sensor component, two measuring pressures are able to be detected independently of each other and compared to each other within the scope of the measuring signal evaluation, or the pressure sensors mutually monitor each other in the case of safety-critical applications, and indicate false measurements or the failure of a sensor.

In one advantageous refinement of this double pressure sensor component, the differential pressure formation already takes place at the measuring signal detection. For this, there exists a pressure connection between the front side and the back side cavity of the component. The diaphragm patterns of the two MEMS components are advantageously also connected mechanically.

Monocrystalline semiconductor diaphragms have particularly good mechanical properties. In addition, monocrystalline silicon wafers and SOI wafers are able to be patterned very well using known methods of micromechanics. In one preferred specific embodiment of the present invention, at least the diaphragm element of the diaphragm pattern is therefore developed in monocrystalline silicon of a silicon wafer or an SOI wafer. Since the mechanical properties of the electrode carrier are not important, in this case, in the measuring signal detection, the electrode carrier may also be built up of a polycrystalline semiconductor material, that is, for example, of polysilicon. The at least one electrode may, in this case, be implemented simply in the form of a doped region or by comprehensive doping of the electrode carrier.

BRIEF DESCRIPTION OF THE DRAWINGS

FIG. 3 shows the schematic sectional representation of a pressure sensor component 300, in which the diaphragm element is developed as an annular diaphragm.

FIG. 7 shows the schematic sectional representation of a double pressure sensor component 700, which is also conceived as a differential pressure sensor.

DETAILED DESCRIPTION

Figure 1A:
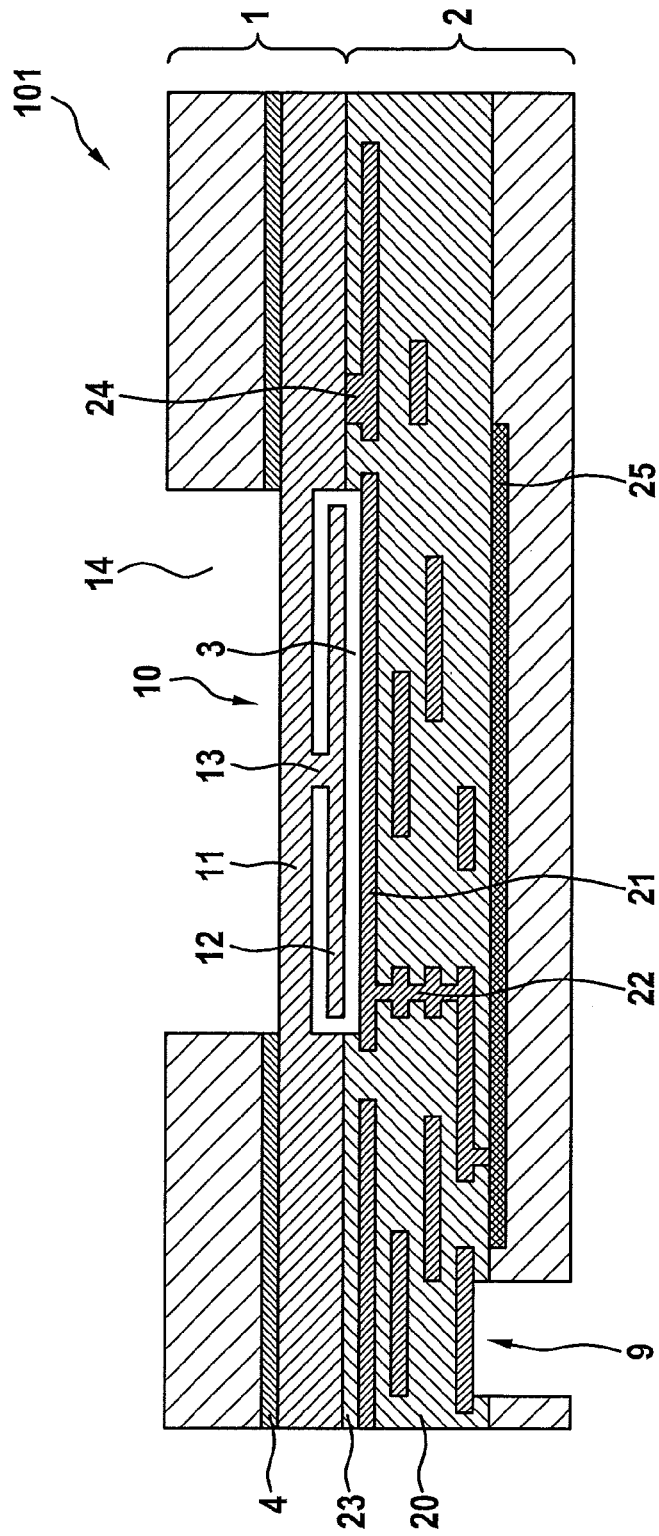
FIG. 1a, b illustrate, with the aid of schematic sectional representations, two mounting variants 101, 102 of a pressure sensor component according to the present invention.
Figure 1B:
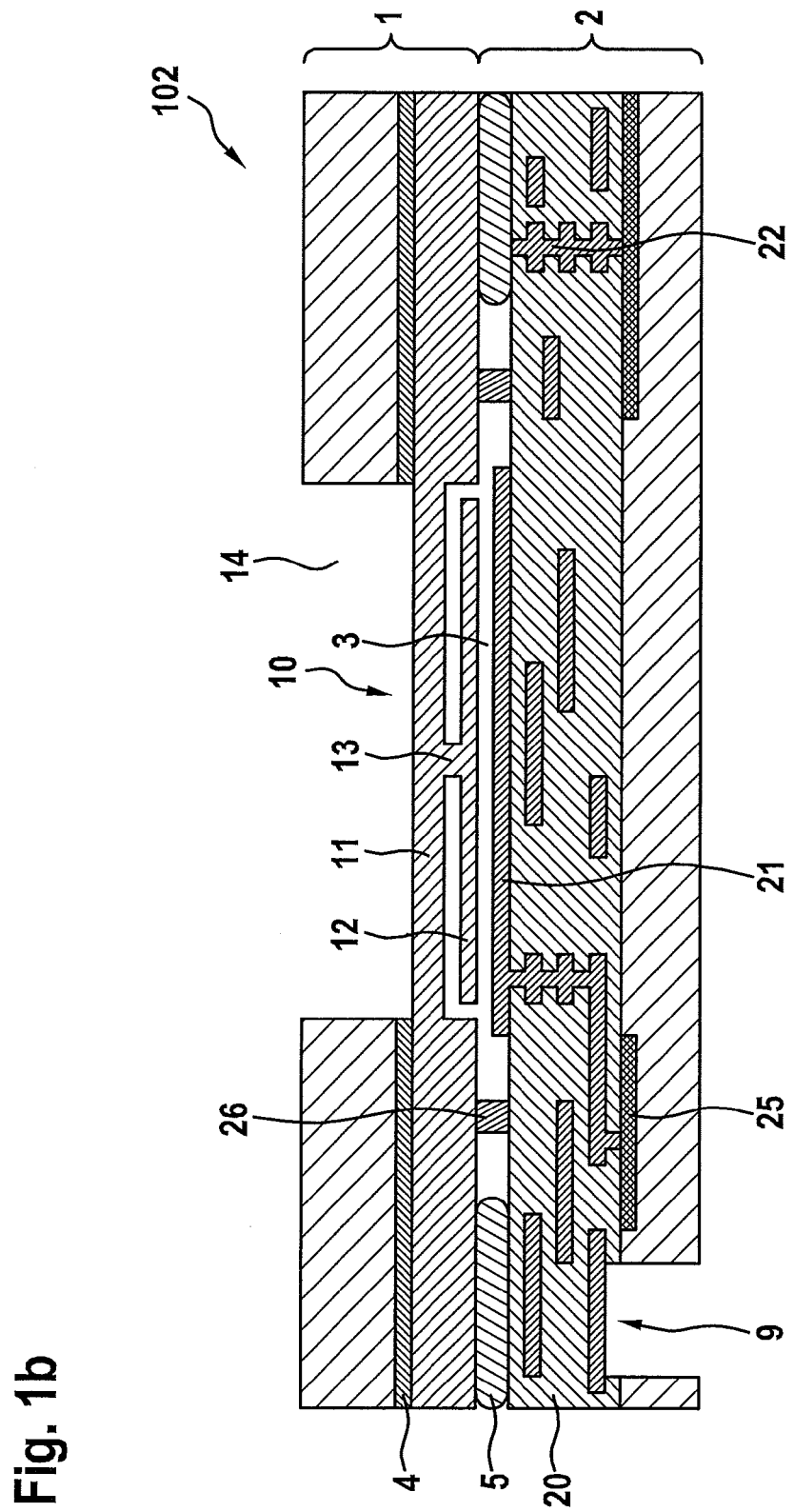

The two pressure sensor components 101 and 102, shown in FIGS. 1a and 1b, each include a MEMS component 1 having a pressure-sensitive diaphragm pattern 10 and an ASIC component 2 having integrated circuit elements 25, which are wired via a multi-layer metallization on the ASIC upper side. This multi-layer metallization will always be designated below as back end stack 20. MEMS component 1 is mounted on back end stack 20 of ASIC component 2, namely in such a way that diaphragm pattern 10 spans a cavity 3 between MEMS component 1 and back end stack 20 of ASIC component 2.

The measuring signal detection takes place capacitively with the aid of a measuring capacitor device. For this, diaphragm pattern 10 includes a diaphragm element 11 and an electrode carrier 12 having at least one electrode of the measuring capacitor device. Diaphragm element 11 closes cavity 3 on the MEMS side. It is warped upon the action of a measuring pressure and is thereby deflected perpendicular to the component plane. Electrode carrier 12 is situated within cavity 3 and is connected mechanically to diaphragm element 11 in such a way that, in the case of a pressure-conditioned deformation of diaphragm element 11, it is also deflected essentially perpendicular to the diaphragm plane, but is not warped in the process. At least one counter-electrode 21 of the measuring capacitor device is developed in a metallization plane of back end stack 20 in the area of cavity 3, so that it lies opposite electrode carrier 12.

ASIC component 2 and MEMS component 1 were produced independently of each other in the wafer composite.

The ASIC wafer was processed with the aid of standard methods, in order to integrate the circuit elements 25 of an evaluation circuit into the wafer surface and to produce the layer construction of back end stack 20. In this context, in the uppermost metallization plane, among other things, one counter-electrode 21 per capacitor device was applied. This counter-electrodes 21 is electrically connected via plated-through contacts 22 and deeper lying metallization planes of back end stack 20 to circuit elements 25. Incidentally, in the masking design of the individual layers of back end stack 20, care was taken that a back end stack surface be created that is as flat as possible.

In the case of component 101, back end stack 20 was finally still provided with a closing layer 23 of $SiO_2$ and/or Si3N4, which were used, for one thing, as electrical insulation between back end stack 20 and MEMS component 1 mounted on it and, for another thing, ensures a distance between diaphragm pattern 10 of MEMS component 1 and back end stack 20. For this, closing layer 23 was removed in the area of counter-electrode 21, where diaphragm pattern 10 of MEMS component 1 is positioned. In addition, during the patterning of closing layer 23, next to the diaphragm area, a metallized contact opening 24 was generated for the electrical linking of MEMS component 1 to ASIC component 2. In the case of component 102, counter-electrodes 21 is on the surface of back end stack 20. The distance between diaphragm pattern 10 of MEMS component 1 and back end stack 20 is ensured in this case by a standoff pattern 26 made of an electrically insulating material, such as $SiO_2$.

As the initial substrate for MEMS component 1, in both pressure sensor components 101 and 102, shown in FIGS. 1a and 1b, an SOI wafer was used in each case. Diaphragm pattern 10 was produced in a layer construction on the monocrystalline silicon layer over oxide layer 4 of the SOI wafer, so that diaphragm element 11 is developed in the monocrystalline silicon layer. Planar electrode carrier 12 as well as point by point connecting point 13 between electrode carrier 12 and diaphragm element 11 are patterned out of a polysilicon layer of the layer construction. The at least one electrode on the electrode carrier was implemented in the form of a doping and is not shown separately here.

During the production of the layer construction for electrode carrier 12, first an $SiO_2$ layer was deposited on the monocrystalline silicon layer over oxide layer 4 of the SOI wafer and patterned, in order to produce oxide islands having contact holes to the monocrystalline silicon layer lying below. In the exemplary embodiment described in this instance, each time only a single contact hole was developed in the center of each oxide island. Over the oxide layer thus patterned, a polysilicon layer was then applied as the starting layer for an epitactically grown silicon layer. This epi-silicon layer was then planarized, for example using a CMP step optionally followed by a plasma etching process.

On the polysilicon starter layer the epi-silicon grows polycrystalline rather than monocrystalline. If the polysilicon starter layer is patterned, and in this context is removed outside the oxide island regions from the monocrystalline silicon layer of the SOI wafer, the epi-silicon is able to grow there monocrystalline on the SOI wafer, while it grows polycrystalline on the polysilicon starter layer, particularly over the oxide island regions. In this way, the mechanical properties of individual regions of the epi-silicon layer are able to be influenced or monocrystalline layer areas may be applied for the integration of electronic circuit components.

The result of this processing is a layer construction on the monocrystalline silicon layer of the SOI wafer, which includes buried $SiO_2$ regions under an epi-silicon layer. Based on the patterning of the $SiO_2$ regions, a crosspiece-like silicon connection is located in their middle, in each case, between the epi-silicon layer and the monocrystalline silicon layer of the SOI wafer. The epi-silicon layer was subsequently patterned with the aid of standard lithographic methods and anisotropic etching methods. In the process, the position and the area of electrode carrier 12 were defined over the $SiO_2$ regions by etching trenches, namely, in such a way that each electrode carrier 12 is linked via crosspiece-like silicon connection 13 in the middle of the corresponding SiO2 region, centrally to the monocrystalline silicon layer of the SOI wafer. If the electrode carrier is not to be developed in the surface of the epi-silicon layer, but is to be set back with respect to this surface, the region of the electrode carrier, for instance, before the patterning of the epi-silicon layer, is able to be still thinned selectively, with the aid of a time-controlled etching process Alternatively to this, additional layers may be deposited on the epi-silicon layer and patterned correspondingly.

Only after this, were the electrode carriers 12 exposed in a further etching step, in which the $SiO_2$ of the buried SiO2 regions were removed via the etching trenches in the epi-silicon layer. As a rule, this takes place with the aid of an HF gas phase etching process, in order to be able to avoid the sticking of electrode carrier 12 to diaphragm element 11.

Within the scope of patterning of the epi-silicon layer, the electrode carriers may also be provided in a planar manner with perforation openings. Thereby the underetching width is clearly reduced during the removal of the $SiO_2$, and thus also the etching time required for it. Furthermore, insulation trenches for the electrical decoupling of diaphragm pattern 10 may be produced within the scope of patterning the epi-silicon layer. Such insulation trenches are situated outside the diaphragm region and its electrical contacting, and extend up to, or even into oxide layer 4 of the SOI wafer. In order to achieve good electric conductivity and contacting of electrode carrier 12, both the monocrystalline silicon layer of the SOI wafer and the epi-silicon layer, deposited on it or grown on it, are able to be highly doped. The type of doping, that is, whether p- or n-doped, is selected so that, in the electrical contacting of the layers, if possible, an ohmic contact is created.

For the implementation of pressure sensor components 101 and 102, the MEMS wafer thus processed was mounted face down in each case, i.e. with the patterned epi-silicon layer on back end stack 20 of the ASIC wafer, the two wafers being aligned with respect to each other in such a way that in each case an electrode carrier 12 of the MEMS wafer and a counter-electrode 21 of back end stack 20 lie opposite to each other.

In the case of component 101, shown in FIG. 1a, the assembly took place using a fusion bonding technique. In this context, not only was a hermetically tight connection produced between the patterned $SiO_2$ closing layer 23 on back end stack 20 of the ASIC wafer and the epi-silicon on the MEMS wafer, but also an electrical contacting of the electrode on the MEMS side via metallized contact opening 24 in SiO2 closing layer 23 of back end stack 20. Since $SiO_2$ closing layer was removed ahead of time from counter-electrode 21, there is a cavity 3 between diaphragm pattern 10 and counter-electrode 21, respectively, which ensures the freedom of motion of diaphragm pattern 10 perpendicular to the component plane. The distance between diaphragm pattern 10 or electrode carrier 12 and counter-electrode 21 is able to be set, in this specific embodiment, very accurately via the layer thickness of $SiO_2$ closing layer 23.

In the case of component 102 shown in FIG. 1b, another bonding technique was used for the mounting of the MEMS wafer on the ASIC wafer, namely, eutectic bonding using Al and Ge, for example. Since an eutectic AlGe bonding connection 5 is electrically conductive, this is used not only for the mechanical connection of the two wafers but also, in each case, for the electrical contacting between the associated MEMS and ASIC components. Eutectic bonding connection 5 was produced, in this case, between the uppermost AlSiCu metallization of back end stack 20 and a Ge layer applied as a bonding frame onto the epi-silicon layer of the MEMS wafer, and was designed so that the capacitor device in the diaphragm region is closed hermetically tightly all the way around. With the aid of the encircling standoff pattern 26 between back end stack 20 of the ASIC wafer and the patterned epi-silicon layer on the MEMS wafer, both the horizontal and the vertical squeezing-out width of bonding material 5 is controlled, and with that, also the electrode gap of the capacitor device.

After the mounting of the MEMS wafer on the ASIC wafer, the MEMS wafer was thinned back on its back side. An SOI wafer may basically be thinned back all the way to oxide layer 4, which may also be removed optionally, in the process. The thickness of the remainder of the MEMS wafer should be selected as a function of the construction and connection technique (AVT) of the pressure sensor component. If, for example, the component is to be mounted on a carrier via the MEMS component, it is recommended for reasons of stability and stress decoupling to have a greater thickness of the remainder.

The ASIC wafer may also be thinned back after the mounting of the MEMS wafer, in order further to reduce the overall height of the pressure sensor component.

In the case of pressure sensor components 101 and 102 shown in FIGS. 1a and 1b, the MEMS wafers were each patterned on the back side, after the thinning back, to a specified remainder thickness, in order to expose diaphragm element 11 of diaphragm pattern 10 and to create a pressure connection 14. To do this, standard lithography methods and etching methods were used, oxide layer 4 of the SOI wafer being used as the etching stop layer. In both cases, oxide layer 4 was then still removed from diaphragm element 11, which is not absolutely necessary.

All the method steps described above, for producing the mechanical and electrical functions of a pressure sensor component according to the present invention were undertaken in the wafer composite. These functions may advantageously be tested even before cutting apart the pressure sensor components, that is, on the wafer plane.

At this point it should be noted that instead of a SOI wafer, a standard silicon wafer may also be used as the initial substrate for the MEMS component. In this case, the diaphragm element is exposed in a time-controlled etching process. This does have cost advantages, but it leads to greater process tolerances in the thickness of the diaphragm element. Instead of an SOI wafer having the layer sequence mono-Si/$SiO_2$/mono-Si, an SOI wafer having the layer sequence mono-Si/SiO2/poly-Si may also be used as the initial substrate for the MEMS component. In this case, the diaphragm element of the diaphragm pattern will then also be patterned out of a polycrystalline layer.

The production method described above supplies pressure sensor components 101 and 102 having a pressure-sensitive monocrystalline diaphragm element 11, which, on the MEMS side, closes a cavity 3 between MEMS component 1 and back end stack 20 of ASIC component 2. Centrically on diaphragm element 11, a planar electrode carrier 12 of polycrystalline silicon is suspended, so that it is situated within cavity 3, parallel to counter-electrode 21 on back end stack 20 of ASIC component 2. If diaphragm element 11 is acted upon by a measuring pressure, diaphragm element 11 gets bent. In the process, the center region of diaphragm element 11 is deflected together with electrode carrier 12. Since electrode carrier 12 is connected to diaphragm element 11 only point by point, it does not become warped in the process but is essentially displaced only plane-parallel, perpendicular to counter-electrode 21. This leads to a change in capacitance between electrode carrier 12 and counter-electrode 21, which is essentially proportional to the measuring pressure.

In the description of FIGS. 2 through 7, only the differences from the specific embodiments of the present invention shown in FIGS. 1a and 1b are explained in greater detail in the following. For identical components, only the corresponding reference numerals of FIGS. 1a and 1b are used. For a discussion of these components, we refer to the description of FIGS. 1a and 1b.

Figure 2A:
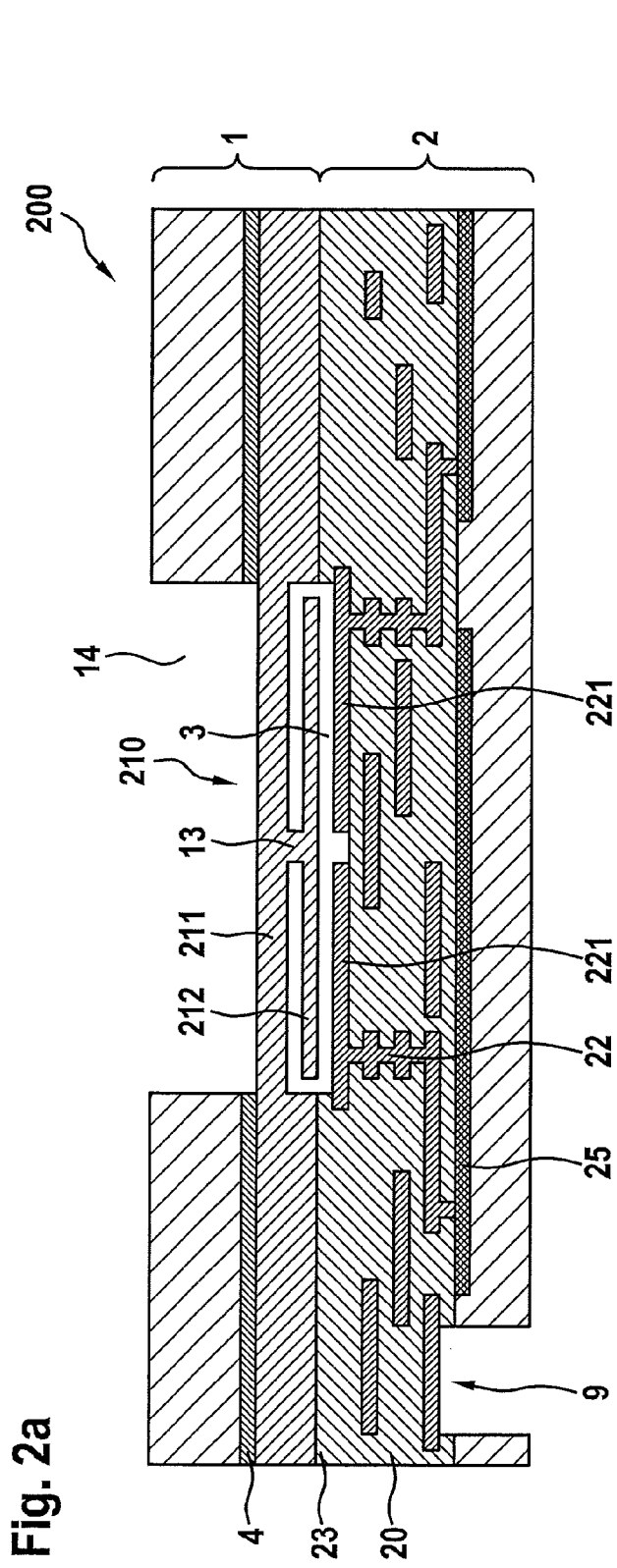
FIG. 2a shows the schematic sectional representation of a pressure sensor component 200, in which the area of the diaphragm element deviates from that of the electrode carrier.
Figure 2B:
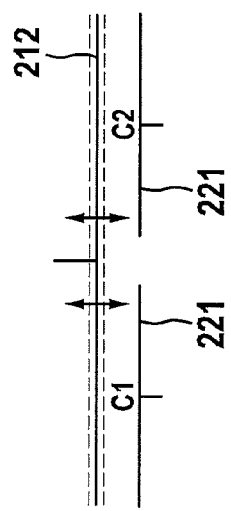
FIG. 2b shows a substitute circuit diagram of the capacitor system of pressure sensor component 200.
Figure 4:
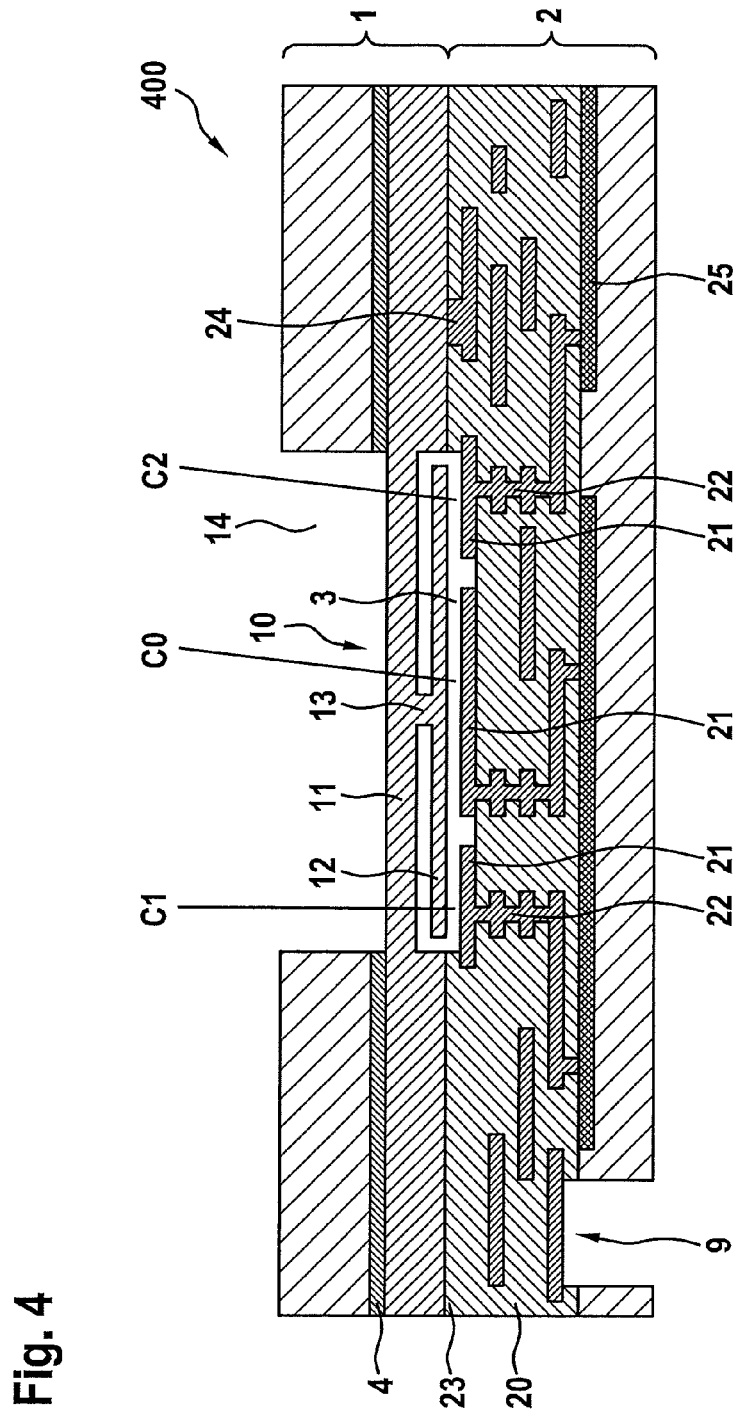
FIG. 4 shows the schematic sectional representation of a pressure sensor component 400 having a triple capacitor device.

Pressure sensor component 200, shown in FIG. 2a, differs in two aspects from pressure sensor component 101, which is shown in FIG. 1. For one thing, counter-electrodes 221 on back end stack 20 of ASIC component 2 is shown here as a double electrode. This has the advantage that the electrode on the MEMS side does not necessarily have to be contacted electrically on electrode carrier 212. The deflection of diaphragm pattern 210 is able to be recorded, in this case, with the aid of two capacitor patterns switched in series via electrode 212 on the MEMS side, which is illustrated by substitute circuit diagram in FIG. 2b.

For another thing, the area of diaphragm element 211 is in this case clearly smaller than the area of electrode carrier 212. Because of that, pressure sensor component 200 has a higher resistance to compression than pressure sensor component 101. The diminished area of diaphragm element 211 does not, however, have a direct effect on the measuring sensitivity of pressure sensor component 200, since the area of electrode carrier 212 has not been reduced in comparison to pressure sensor component 101. FIG. 2a illustrates that a pressure sensor component, according to the present invention, is able to be adapted by variations in the area of the diaphragm element to various pressure ranges without this having a direct effect on the measuring sensitivity, since the area of the electrode carrier is able to be selected largely independently of the diaphragm element.

In pressure sensor component 300 shown in FIG. 3, counter-electrode 321 on back end stack 20 of ASIC component 2 is developed as a double electrode.

The essential difference between pressure sensor component 101 shown in FIG. 1a and pressure sensor component 300 is made up, however, of diaphragm pattern 310. Diaphragm element 311 is developed in this case as an annular diaphragm or rather as a diaphragm reinforced in the center region. In addition, the crosspiece width of central suspension 313 of electrode carrier 213 has been clearly enlarged. Because of that, it is prevented, for one thing, that the center region of diaphragm element 311 is warped. For another thing, the center region of diaphragm pattern 310 is thereby stabilized overall, in order to prevent bending of electrode carrier 312 based on transverse accelerations.

The influence of transverse accelerations on the sensor signal may, however, also be eliminated or at least reduced, within the scope of measuring signal evaluation. For this purpose, the component variant shown in FIG. 4, pressure sensor component 400, is equipped with a capacitor device which includes three capacitors C0, C1 and C2 connected in parallel. Bending of electrode carrier 12, conditioned upon transverse accelerations leads, in this case, to different capacitance changes of capacitors C1 and C2, and is thus able to be detected and also quantitatively ascertained with the aid of capacitor C0. This opens up the possibility of also correcting the pressure sensor signal within the scope of the measuring signal evaluation. Pressure sensor component 400 is, strictly speaking, also a combination sensor, which is able to measure both pressure and acceleration or vibrations.

The electrical contacting of pressure sensor components 101, 102, 200, 300 and 400, shown in FIGS. 1a, 1b, 2a, 3 and 4 takes place using wire bonding via a bonding pad opening 9 on the back side of the ASIC component 2. For this purpose, the ASIC back side may also be rethinned in a defined manner. By this type of external component contacting, pressures of aggressive media may also be measured, without the electrical contacting being corroded by the measuring medium. In addition, the MEMS component of the pressure sensor component may, in this case, be directly flanged onto a housing wall.

Figure 5:
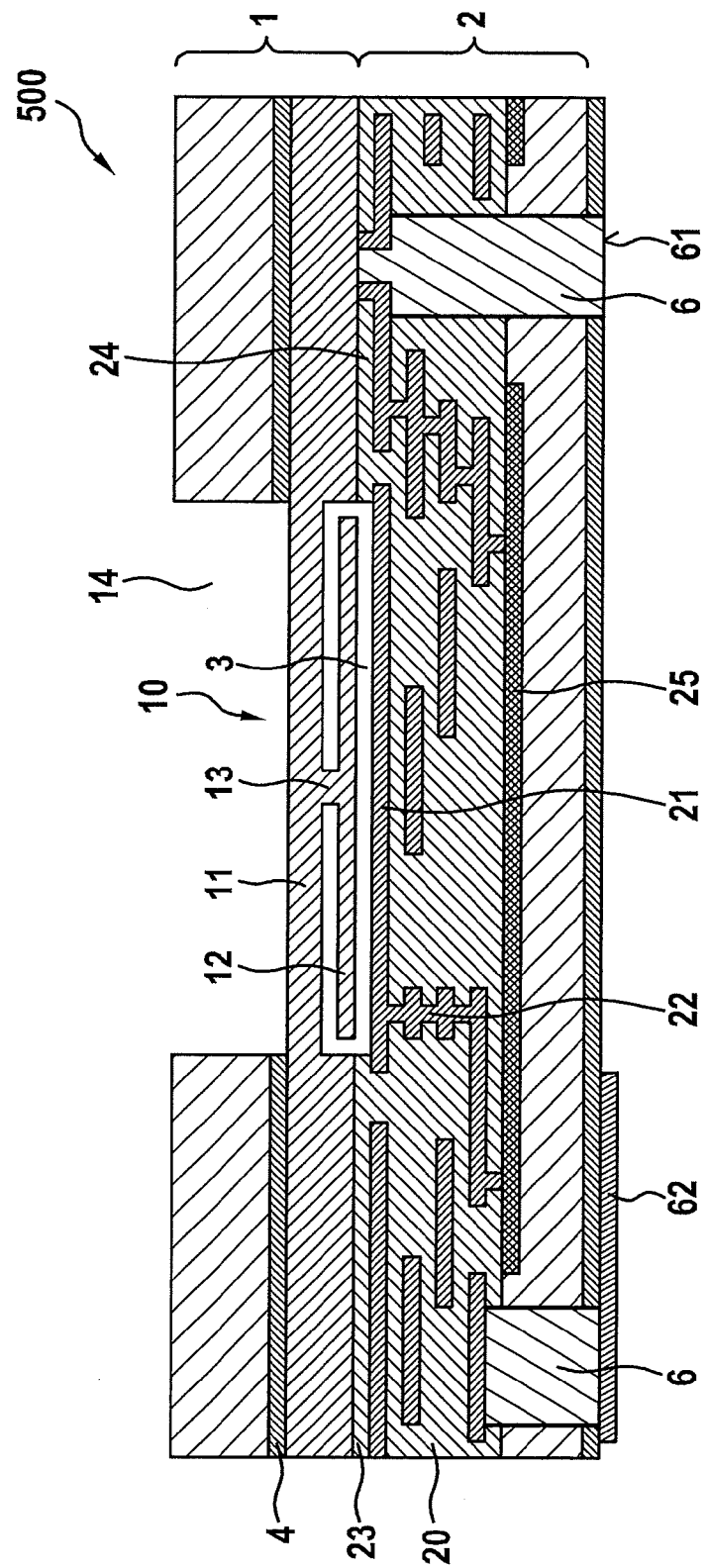
FIG. 5 illustrates the internal and external contacting of a pressure sensor component 500, according to the present invention, with the aid of a schematic sectional representation.

Pressure sensor component 500 shown in FIG. 5 differs from pressure sensor component 101 shown in FIG. 1a in the type of electrical contacting of electrode 12 on the MEMS side, and in the development of an external component contacting 6. In this case, electrically insulated contact holes have been produced in ASIC component 2 with the aid of CVD method and plasma etching methods, which open out on a contact point on the MEMS side and a lower metallization plane of back end stack 20. The contact holes were filled with a conductive material, such as tungsten or a silver paste, and after planarization of the ASIC back side, were provided with bonding pads 61 or were wired via circuit traces 62 on the ASIC back side. Alternatively, the contact holes may also be coated with a conductive material and subsequently filled, for instance, using a polymer. Bonding pad patterns on the ASIC back side for external component contacting make possible the use of flip-chip technique during the mounting of the pressure sensor component, for instance, on circuit boards.

At this time, we should point out the possibility of electrically contacting a pressure sensor component, according to the present invention, with the aid of wire bonding. For this purpose, during the back side patterning of the mounted MEMS wafer, which includes the steps of thinning back up to oxide layer 4, optional removing of oxide layer 4, patterning diaphragm element 11 using as etching stop on closing layer 23 of ASIC component 2 and patterning closing layer 23, the bonding pad areas in the surface of the ASIC back end stack is exposed.

The pressure sensor components, shown in FIGS. 1 through 5, are absolute pressure sensors in which the diaphragm pattern each spans a closed cavity, so that the diaphragm pattern is only able to be acted upon on one side by a measuring pressure.

Figure 6:
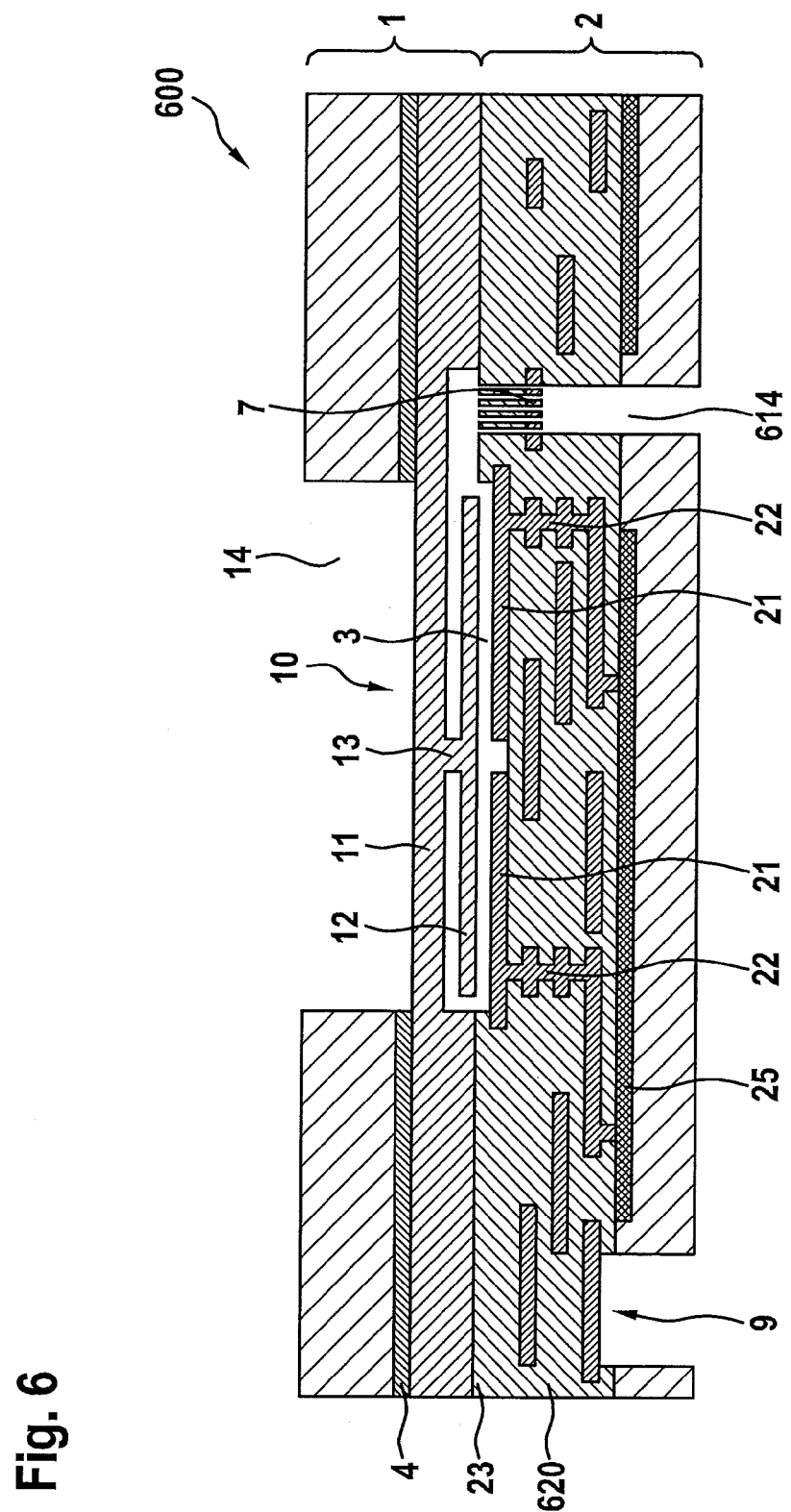
FIG. 6 shows the schematic sectional representation of a pressure sensor component 600, which is conceived as a differential pressure sensor.

By contrast to this, pressure sensor component 600 shown in FIG. 6 is designed as a differential pressure sensor, and is accordingly equipped with a second pressure connection 614. This extends from the ASIC back side through back end stack 620 into cavity 3. In the region of ASIC-side pressure connection 614, there is located a screen-like patterned metallization plane. Cavity 3 and, with that, the capacitor device, are kept free from particles by this screen pattern 7. Alternatively, the second pressure connection may also be developed on the MEMS side, as a through hole in the MEMS component, which opens out into the cavity.

The variant of a differential pressure sensor component shown in FIG. 7 is not only insensitive to particles in the measuring environment but stands out by a particularly high media resistance and moisture stability. This pressure sensor component 700 includes an ASIC component 702 having integrated circuit elements 25 of an evaluation circuit and a front side back end stack 20 for wiring this circuit elements 25. In the upper side of the front side back end stack 20, a double electrode or an annular electrode 21 is developed as a counter-electrode of a first measuring capacitor device, as well as a bonding pad 706 for the external contacting of component 700. On front side back end stack 20 a first MEMS component 1 having a diaphragm pattern 10 is mounted, so that electrode carrier 12 of diaphragm pattern 10 is situated within a cavity 3, between MEMS component 1 and front side back end stack 20 and opposite double or annular electrode 21.

In addition, the thinned back side of ASIC component 702 was provided with a back side back end stack 720, which is connected electrically via plated-through contacts 722 to front side back end stack 20. In the upper side of back side back end stack 720, a double electrode or annular electrode 721 is developed as a counter-electrode of a second measuring capacitor device. On back side back end stack 720 a second MEMS component 701 having a diaphragm pattern 710 is mounted, so that electrode carrier 712 of diaphragm pattern 710 is situated within a cavity 703, between MEMS component 701 and front side back end stack 720 and opposite double or annular electrode 721.

Between front side and back side cavities 3 and 703 there exists a pressure connection in the form of a through-hole channel 8, which extends through the entire layer construction of ASIC component 702. Within through-hole channel 8, a connecting crosspiece 81 is developed, which connects diaphragm patterns 10 and 710 of the two MEMS components 1 and 701. Crosspiece 81 is freely movable within through-hole channel 8, so that it does function as a mechanical connection of the two diaphragm patterns 10 and 710, but does not impede the diaphragm motions.

This design makes possible a differentially capacitive comparison of two measuring pressures, neither of the two capacitor devices coming into direct contact with the measuring media, since the electrodes are in each case situated within a cavity 3 and 703, without a media access opening.

What is claimed is:

1. A hybrid integrated pressure sensor component, comprising:
   a MEMS component having at least one pattern element that is deflectable perpendicular to a component plane and equipped with at least one electrode of a measuring capacitor device; and
   an ASIC component having integrated circuit elements and at least one back end stack, at least one counter-electrode of the measuring capacitor device being developed in a metallization plane of the back end stack, wherein:
      the MEMS component is mounted on the back end stack of the ASIC component,
      the MEMS component includes at least one pressure-sensitive diaphragm pattern,
      the MEMS component is mounted on the ASIC component in such a way that the pressure-sensitive diaphragm pattern spans a cavity between the MEMS component and the back end stack of the ASIC component,
      the pressure-sensitive diaphragm pattern includes a diaphragm element and at least one electrode carrier,
      the diaphragm element closes the cavity on an MEMS side, and
      the at least one electrode carrier is situated within the cavity and is connected mechanically to the diaphragm element in such a way that a pressure-conditioned deformation of the diaphragm element effects a deflection of the at least one electrode carrier essentially perpendicular to a diaphragm plane, but no deformation of the at least one electrode carrier itself.

2. The pressure sensor component as recited in claim 1, wherein the at least one electrode carrier is implemented as a planar pattern element oriented essentially parallel to the diaphragm element.

3. The pressure sensor component as recited in claim 1, wherein:
   the at least one electrode carrier is connected point by point to the diaphragm element, and
   at least one connecting point is developed in a center region of the diaphragm element.

4. The pressure sensor component as recited in claim 1, wherein:
   the at least one electrode carrier is connected via a plurality of connection points to the diaphragm element, and
   the connection points are situated essentially on a same level of the deflected diaphragm element.

5. The pressure sensor component as recited in claim 1, wherein a center section of the diaphragm element is reinforced.

6. The pressure sensor component as recited in claim 1, further comprising:
   at least two capacitor devices developed in an area of the cavity on the at least one electrode carrier and the back end stack, so that in addition to a deflection perpendicular to the diaphragm plane, one of a tilting and a bending of the at least one electrode carrier is also detected.

7. The pressure sensor component as recited in claim 1, wherein the cavity has at least one pressure connection.

8. The pressure sensor component as recited in claim 1, wherein:
   the ASIC component is provided with a back end stack on a back side,
   a second MEMS component having a pressure-sensitive diaphragm pattern is mounted on the back side back end stack in such a way that the pressure-sensitive diaphragm pattern spans a second cavity between the second MEMS component and the back side back end stack, the diaphragm pattern of the second MEMS component being equipped with at least one electrode of a measuring capacitor device, and
   at least one counter-electrode of the measuring capacitor device is developed in a metallization plane of the back side back end stack of the ASIC component.

9. The pressure sensor component as recited in claim 1, wherein:
   at least the diaphragm element of the diaphragm pattern is developed in a monocrystalline silicon of one of a silicon wafer and an SOI wafer, and
   at least one electrode of the diaphragm pattern is implemented as a doped region of the at least one electrode carrier.

10. The pressure sensor component as recited in claim 7, wherein:
    in the ASIC component the at least one pressure connection to the cavity is developed, and
    in the metallization plane of the back end stack a grid pattern is developed in an area of the pressure connection.

11. The pressure sensor component as recited in claim 8, wherein:
    a pressure connection between the two cavities exists, and
    the diaphragm patterns of the two MEMS components are mechanically connected.

\* \* \* \* \*